(12) United States Patent
Kimura

(10) Patent No.: US 9,390,954 B2
(45) Date of Patent: Jul. 12, 2016

(54) SUBSTRATE TRANSFER ROBOT, SUBSTRATE TRANSFER SYSTEM, AND METHOD FOR DETECTING ARRANGEMENT STATE OF SUBSTRATE

(71) Applicant: KABUSHIKI KAISHA YASKAWA DENKI, Kitakyushu-shi (JP)

(72) Inventor: Yoshiki Kimura, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 0 days.

(21) Appl. No.: 14/284,364

(22) Filed: May 21, 2014

(65) Prior Publication Data
US 2014/0350713 A1    Nov. 27, 2014

(30) Foreign Application Priority Data

May 22, 2013  (JP) ................. 2013-107806

(51) Int. Cl.
| | |
|---|---|
| H01L 21/68 | (2006.01) |
| H01L 21/677 | (2006.01) |
| B25J 13/08 | (2006.01) |
| H01L 21/687 | (2006.01) |
| B25J 9/04 | (2006.01) |
| H01L 21/67 | (2006.01) |
| B25J 9/16 | (2006.01) |

(52) U.S. Cl.
CPC .......... *H01L 21/67766* (2013.01); *B25J 9/042* (2013.01); *B25J 9/1679* (2013.01); *B25J 13/08* (2013.01); *H01L 21/67265* (2013.01); *H01L 21/68707* (2013.01); *G05B 2219/40087* (2013.01); *G05B 2219/45031* (2013.01); *Y10S 901/02* (2013.01); *Y10S 901/46* (2013.01)

(58) Field of Classification Search
CPC ................... H01L 21/67265; H01L 21/68707; B25J 13/088
See application file for complete search history.

(56) References Cited

U.S. PATENT DOCUMENTS

| | | | | |
|---|---|---|---|---|
| 5,730,574 | A  * | 3/1998 | Adachi | H01L 21/67236 414/225.01 |
| 7,107,125 | B2 * | 9/2006 | Yim et al. | 700/258 |
| 7,547,209 | B2 * | 6/2009 | Asari | B25J 9/163 432/239 |

(Continued)

FOREIGN PATENT DOCUMENTS

| | | |
|---|---|---|
| JP | 10-308436 | 11/1998 |
| JP | 2010-219209 | 9/2010 |
| TW | 201247376 | 12/2012 |

OTHER PUBLICATIONS

Korean Office Action for corresponding KR Application No. 10-2014-0060159, Oct. 7, 2015.

(Continued)

*Primary Examiner* — Gene Crawford
*Assistant Examiner* — Thomas Randazzo
(74) *Attorney, Agent, or Firm* — Mori & Ward, LLP

(57) ABSTRACT

A substrate transfer robot includes a hand and a controller. The hand includes at least one detector configured to detect an arrangement state of a substrate in a substrate storage. The controller is configured to control the at least one detector to detect the arrangement state of the substrate in the substrate storage with the hand inclined in plan view toward a rotation center of the substrate transfer robot relative to a substrate storage center line. The substrate storage center line is in a direction perpendicular to a front surface of the substrate storage.

20 Claims, 5 Drawing Sheets

(56) References Cited

U.S. PATENT DOCUMENTS

| | | | | |
|---|---|---|---|---|
| 7,572,092 | B2* | 8/2009 | Hofmeister | B25J 19/02 294/907 |
| 7,925,378 | B2* | 4/2011 | Gilchrist | H01L 21/67265 414/222.02 |
| 8,473,096 | B2* | 6/2013 | Matsuo | H01L 21/67745 700/121 |
| 8,573,919 | B2* | 11/2013 | Gilchrist | B25J 9/0087 414/744.5 |
| 8,820,809 | B2* | 9/2014 | Ando | H01L 21/67265 294/213 |
| 8,892,242 | B2* | 11/2014 | Kimura | H01L 21/67265 414/796.4 |
| 2003/0108415 | A1 | 6/2003 | Hosek et al. | |
| 2004/0068347 | A1* | 4/2004 | Aalund | H01L 21/67265 700/245 |
| 2008/0101912 | A1* | 5/2008 | Martin | H01L 21/6719 700/254 |
| 2008/0267747 | A1* | 10/2008 | DiBella | H01L 21/68707 414/225.01 |
| 2009/0050270 | A1* | 2/2009 | Bagley | H01L 21/67265 156/345.24 |
| 2010/0111650 | A1* | 5/2010 | Quach | C23C 16/54 414/221 |
| 2012/0290124 | A1 | 11/2012 | Kimura | |

OTHER PUBLICATIONS

Taiwanese Office Action for corresponding TW Application No. 103105275, May 5, 2016.

* cited by examiner

First embodiment

State in which substrate is placed in the cassette

State in which hand center line matches substrate storage center line

Second embodiment

SUBSTRATE TRANSFER ROBOT, SUBSTRATE TRANSFER SYSTEM, AND METHOD FOR DETECTING ARRANGEMENT STATE OF SUBSTRATE

CROSS-REFERENCE TO RELATED APPLICATIONS

The present application claims priority under 35 U.S.C. §119 to Japanese Patent Application No. 2013-107806, filed May 22, 2013. The contents of this application are incorporated herein by reference in their entirety.

BACKGROUND

1. Field of the Invention

The present invention relates to a substrate transfer robot, a substrate transfer system, and a method for detecting an arrangement state of a substrate.

2. Discussion of the Background

Japanese Unexamined Patent Application Publication No. 2010-219209 discloses a substrate transfer apparatus (substrate transfer robot) that includes a hand. The hand is provided with a transmission optical sensor to detect an arrangement state of a substrate arranged in a substrate storage cassette. The substrate transfer apparatus (substrate transfer robot) recited in Japanese Unexamined Patent Application Publication No. 2010-219209 includes a transferer arm. At a distal end of the transferer arm, the hand is disposed. The hand has an approximate V shape in plan view (in other words, a shape furcated at the distal end). At a distal end of the hand, the transmission optical sensor is disposed. The transmission optical sensor includes a light emitting device and a light receiving device. The light emitting device emits a beam, while the light receiving device receives the beam. In Japanese Unexamined Patent Application Publication No. 2010-219209, the approximately V-shaped hand (light emitting device and light receiving device) is moved to a position below the substrate arranged in the substrate storage cassette and then is moved upward. Here, the substrate transfer apparatus detects an arrangement state of the substrate arranged in the substrate storage cassette (examples of the arrangement state including presence or absence of the substrate, posture of the substrate, and protruding state of the substrate from the cassette) based on whether the light receiving device has received the beam.

In conventional substrate transfer apparatuses (substrate transfer robots) such as the substrate transfer apparatus recited in Japanese Unexamined Patent Application Publication No. 2010-219209, the arrangement state of the substrate arranged in the substrate storage cassette is detected with a hand center line (which is a straight line connecting between the turning center of the hand and a substrate holding center, which is the center of the holding of the substrate by the hand) located in a direction perpendicular to the front surface of the substrate storage cassette in plan view.

SUMMARY

According to one aspect of the present disclosure, a substrate transfer robot includes a hand and a controller. The hand includes at least one detector configured to detect an arrangement state of a substrate in a substrate storage. The controller is configured to control the at least one detector to detect the arrangement state of the substrate in the substrate storage with the hand inclined in plan view toward a rotation center of the substrate transfer robot relative to a substrate storage center line. The substrate storage center line is in a direction perpendicular to a front surface of the substrate storage.

According to another aspect of the present disclosure, a substrate transfer system includes a substrate transfer robot. The substrate transfer robot is disposed in a substrate transfer robot installment area surrounded by a substrate storage and a processing apparatus. The substrate transfer robot includes a hand and a controller. The hand includes a detector configured to detect an arrangement state of a substrate in the substrate storage. The controller is configured to control the detector to detect the arrangement state of the substrate in the substrate storage with the hand inclined in plan view toward a rotation center of the substrate transfer robot relative to a substrate storage center line. The substrate storage center line is in a direction perpendicular to a front surface of the substrate storage.

According to another aspect of the present disclosure, a method is for detecting an arrangement state of a substrate. The method includes moving a hand so as to make the hand inclined in plan view toward a rotation center of a substrate transfer robot relative to a substrate storage center line. The substrate storage center line is in a direction perpendicular to a front surface of a substrate storage. A detector disposed in the hand is controlled to detect the arrangement state of the substrate in the substrate storage with the hand inclined toward the rotation center of the substrate transfer robot relative to the substrate storage center line.

According to the other aspect of the present disclosure, a substrate transfer robot includes a hand. The hand includes a detector configured to detect an arrangement state of a substrate in a substrate storage. When the detector detects the arrangement state of the substrate in the substrate storage, the hand is at a position where the hand is inclined in plan view toward a rotation center of the substrate transfer robot relative to a substrate storage center line. The substrate storage center line is in a direction perpendicular to a front surface of the substrate storage.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
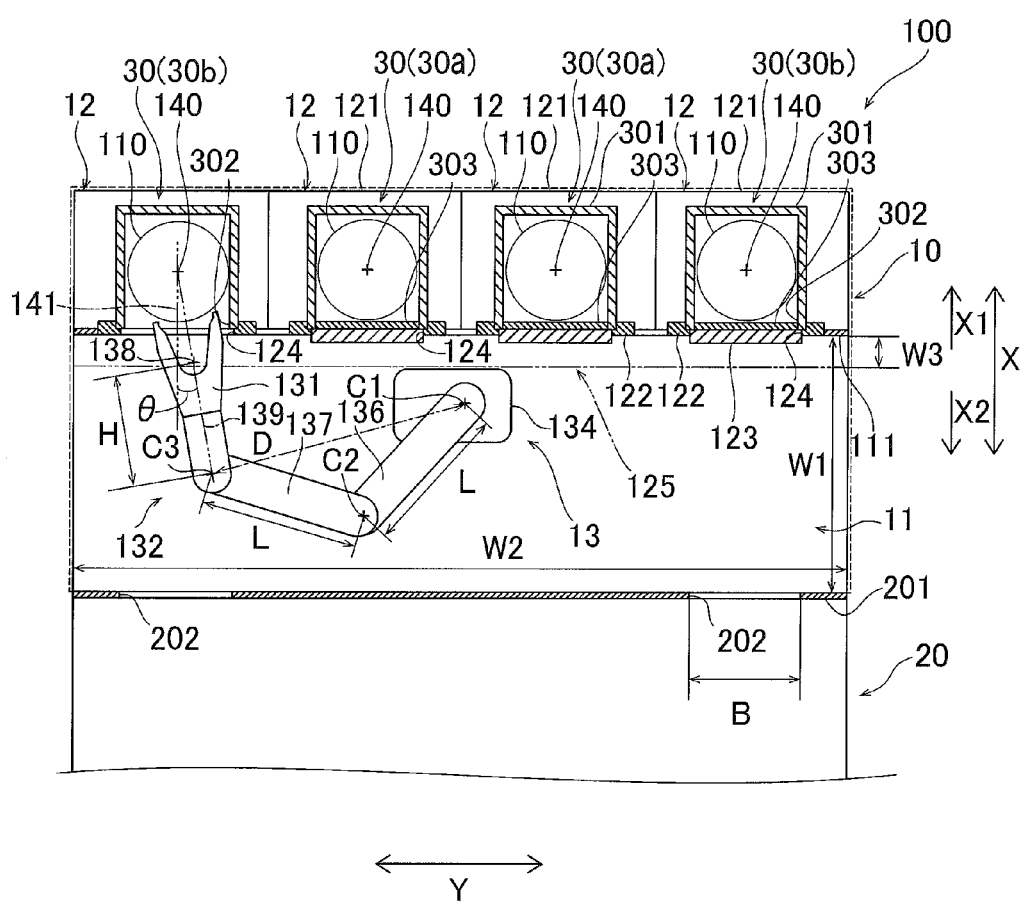
FIG. 1 is a plan view of a substrate processing system according to a first embodiment, illustrating a general arrangement of the substrate processing system.

The embodiments will now be described with reference to the accompanying drawings, wherein like reference numerals designate corresponding or identical elements throughout the various drawings.

First Embodiment

First, by referring to FIGS. 1 to 4, a configuration of a substrate processing system 100 according to the first embodiment will be described.

Figure 2:
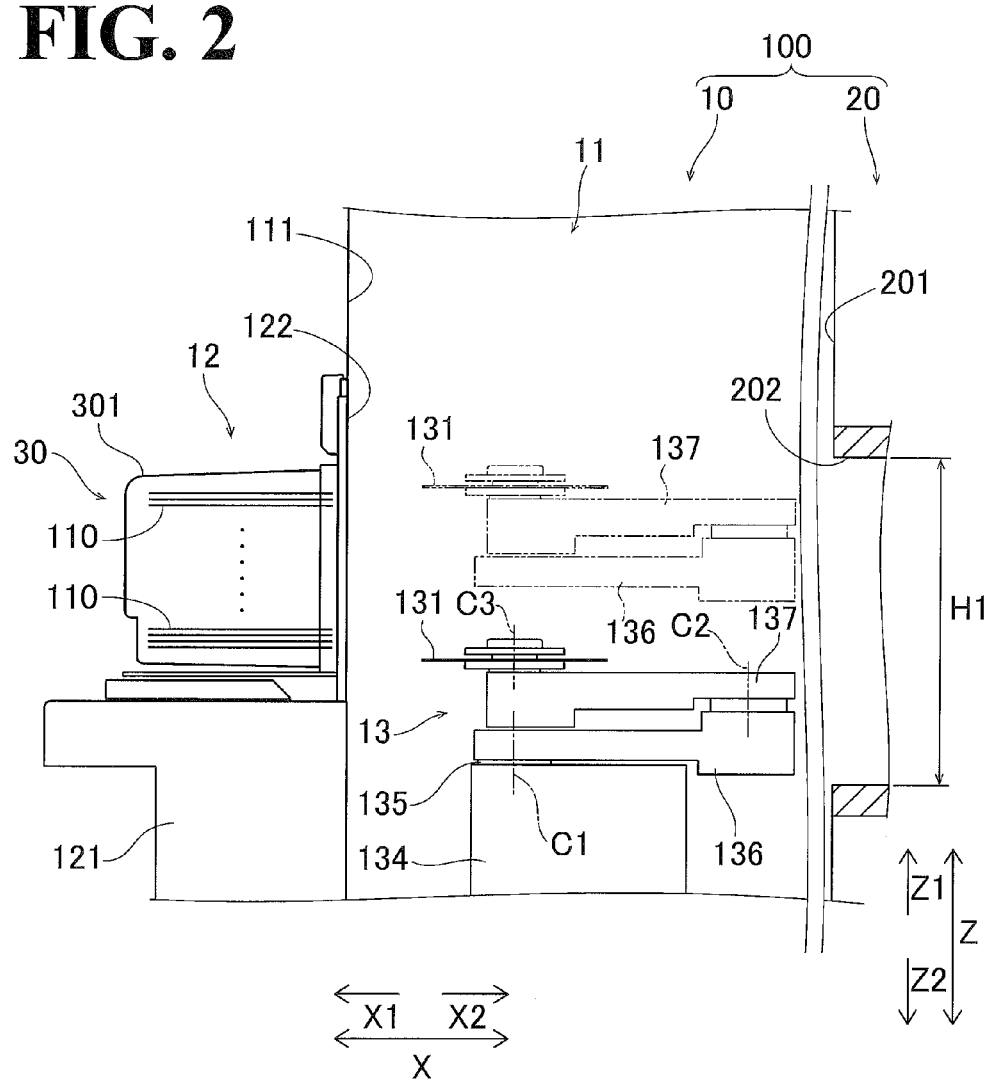
FIG. 2 is a side view of the substrate processing system according to the first embodiment, schematically illustrating a general arrangement of the substrate processing system.

As shown in FIGS. 1 and 2, the substrate processing system 100 includes a substrate transfer system 10 and a processing apparatus 20. The substrate transfer system 10 transfers substrates 110. In the substrate processing system 100, the substrate transfer system 10 transfers a substrate 110 to the processing apparatus 20. The processing apparatus 20 processes the transferred substrate 110 in a production process of semiconductor devices.

The substrate transfer system 10 includes a robot installment area 11, a plurality of (four) load ports 12, and a substrate transfer robot 13. In the load ports 12, cassettes (substrate storage cassettes) 30 are disposed to accommodate the substrates 110. The substrate transfer robot 13 is disposed in the robot installment area 11. The substrate transfer system 10 is a system in which the substrate transfer robot 13 transfers the substrates 110 between the cassettes 30 and the processing apparatus 20. The cassettes 30 are examples of the "substrate storage". The robot installment area 11 is an example of the "substrate transfer robot installment area".

In plan view (when viewed from above), the substrate transfer system 10 has an outer shape (as indicated by the broken line shown in FIG. 1) that is a combination of the installment area of the load ports 12 and the robot installment area 11, in which the substrate transfer robot 13 is installed. The robot installment area 11 is a box-shaped area that has a rectangular shape in plan view surrounded by a front wall 111, on which the load ports 12 are arranged, and by a rear wall 201 and side walls of the processing apparatus 20. The substrate transfer system 10 also includes an FFU (Fan Filter Unit), not shown, to keep the air in the robot installment area 11 clean. In the following description, the direction X in plan view, in which the front wall 111 and the rear wall 201 face each other, will be referred to as a front-rear direction, and the longitudinal direction (Y direction) in plan view along the front wall 111 and the rear wall 201 will be referred to as a lateral direction. The robot installment area 11 has a width W1 in the front-rear direction and a width W2 in the lateral direction.

Each of the cassettes 30 is a semiconductor wafer container that is open on the front and conforms with the SEMI (Semiconductor Equipment and Materials International) standards. Such a container is referred to as a FOUP (Front Open Unified Pod). As shown in FIGS. 1 and 2, each cassette 30 includes a container main body 301 and a container door 303. The container main body 301 has a front opening 302. The container door 303 is removably fitted with the front opening 302. The container main body 301 and the container door 303 of each cassette 30 define a hermetically sealed space. The space serves as a locally clean area to ensure that the container main body 301 can accommodate a plurality of substrates 110. Each cassette 30 is capable of accommodating the plurality of substrates 110 at different height positions of the container main body 301. For example, the four cassettes 30 each have 25 placement positions in the vertical direction, which ensures that a maximum of 25 substrates 110 can be accommodated in stack.

Each of the load ports 12 holds the cassette 30 accommodating the substrates 110 and has a function to open and close the inside of the cassette 30 relative to the robot installment area 11. The load ports 12 are disposed on the front side (X1 direction side) of the robot installment area 11 to abut on the front wall 111, and are aligned with each other in the Y direction along the front wall 111. Each load port 12 includes a stand 121, a front plate 122, and a port door 123. Each load port 12 is capable of accepting one cassette 30 in such a manner that the one cassette 30 is detachably fixed (mounted) to the upper surface of the stand 121. The front plate 122 is formed within a perpendicular plane along the Y direction and constitutes a part of the front wall 111 of the robot installment area 11. The front plate 122 is in the form of a window (frame) with an opening 124. The opening 124 is opened and closed by the port door 123. Each load port 12 includes a door opening/closing mechanism, not shown. The door opening/closing mechanism holds the port door 123 and the container door 303 of the cassette 30 to pull the port door 123 and the container door 303 rearward (in the X2 direction) through the opening 124, and moves the port door 123 and the container door 303 downward (in the Z2 direction). In this manner, the door opening/closing mechanism opens the internal space of the cassette 30 to the robot installment area 11. When the cassette 30 is taken out, the door opening/closing mechanism closes the port door 123 and the container door 303.

Figure 3:
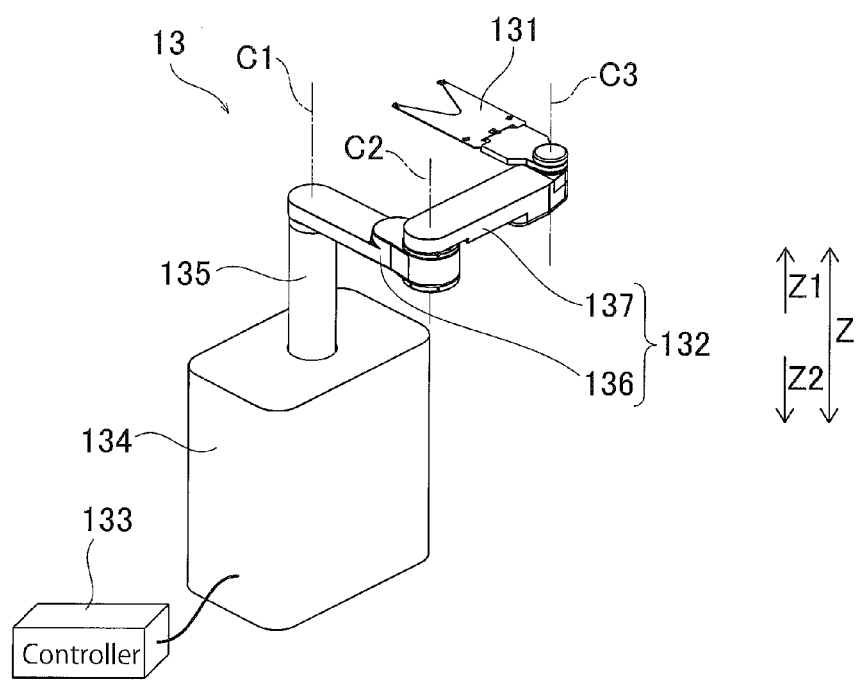
FIG. 3 is a perspective view of a substrate transfer robot of the substrate processing system according to the first embodiment.

As shown in FIGS. 1 to 3, the substrate transfer robot 13 is a horizontal multi-articular robot and includes an edge-grip hand 131, an arm 132, and a controller 133. The hand 131 is capable of approaching the cassette 30 and holding the substrate 110. The arm 132 moves the hand 131. The controller 133 controls the elements of the substrate transfer robot 13. The arm 132 is coupled to the hand 131 at the distal end of the arm 132, and includes a plurality of arm members. The plurality of arm members are coupled together to be elongate from a swing center (turning center) C1, described later, of the atm 132 to the distal end of the arm 132 in such a manner that the arm members are turnable relative to each other at their ends. More specifically, the substrate transfer robot 13 further includes a base member 134 and a support shaft 135. In this embodiment, the arm 132 includes two arms, namely, a first arm 136 and a second arm 137. Also in the first embodiment, the swing center C1 of the first arm 136 is disposed at a position closer to the front wall 111, on which the load ports 12 are disposed, than to the rear wall 201 of the processing apparatus 20 (see FIG. 1). Alternatively, the swing center C1 of the first arm 136 may be disposed at a position closer to the rear wall 201.

The support shaft 135 is supported by the base member 134. Also the support shaft 135 is elongate in a direction perpendicular to the upper surface of the base member 134. To the upper end of the support shaft 135, one end of the first arm 136 is coupled. The first arm 136 is turnable on a horizontal plane about the support shaft 135 as a turning axis. To the other end of the first arm 136, one end of the second arm 137 is coupled. The second arm 137 is turnable on a horizontal plane about the one end of second arm 137 coupled to the first arm 136. To the other end of the second arm 137, the hand 131 is coupled. The hand 131 is turnable on a horizontal plane about the portion of connection between the hand 131 and the second arm 137. Also the hand 131 is capable of supporting the edge (outer circumference) of the substrate 110. Thus, the substrate transfer robot 13 ensures that the first arm 136, the second arm 137, and the hand 131 are capable of turning independently (individually) about respective three turning axes, namely, the swing center C1 of the first arm 136, the swing center C2 of the second arm 137, and the swing center C3 of the hand 131. As seen from the above description, the swing center C1 of the first arm 136 also serves as the swing center of the entire the arm 132 about the support shaft 135.

The first arm 136 and the second arm 137 have approximately the same link lengths. Specifically, as shown in FIG. 1, the link length of the first arm 136, which is from the swing center C1 of the first arm 136 to the swing center C2 of the second arm 137, and the link length of the second arm 137, which is from the swing center C2 of the second arm 137 to the swing center C3 of the hand 131, are approximately the same, namely, length L. This eliminates or minimizes complication of the operation control of the elements at the time of transfer of the substrate 110, as compared with case of the first arm 136 and the second arm 137 having different link lengths. The hand 131 has a hand length H, which is from the swing center C3 of the hand 131 to a substrate holding center 138. The hand length H is smaller than the link length L of each of the first arm 136 and the second arm 137. The hand length H is set such that the maximum length of the hand 131 plus the substrate 110 when the hand 131 is holding the substrate 110 is approximately equal to the entire length of the first arm 136 (the second arm 137). The arm 132, which is made up of the first arm 136 and the second arm 137, has an operable range that is within a circle of a radius 2L.

The substrate transfer robot 13 moves the support shaft 135 up and down to integrally move up and down the first arm 136, the second arm 137, and the hand 131. This enables the substrate transfer robot 13 to take in and out the substrate 110 to and from all the different height positions in the cassette 30.

Figure 4:
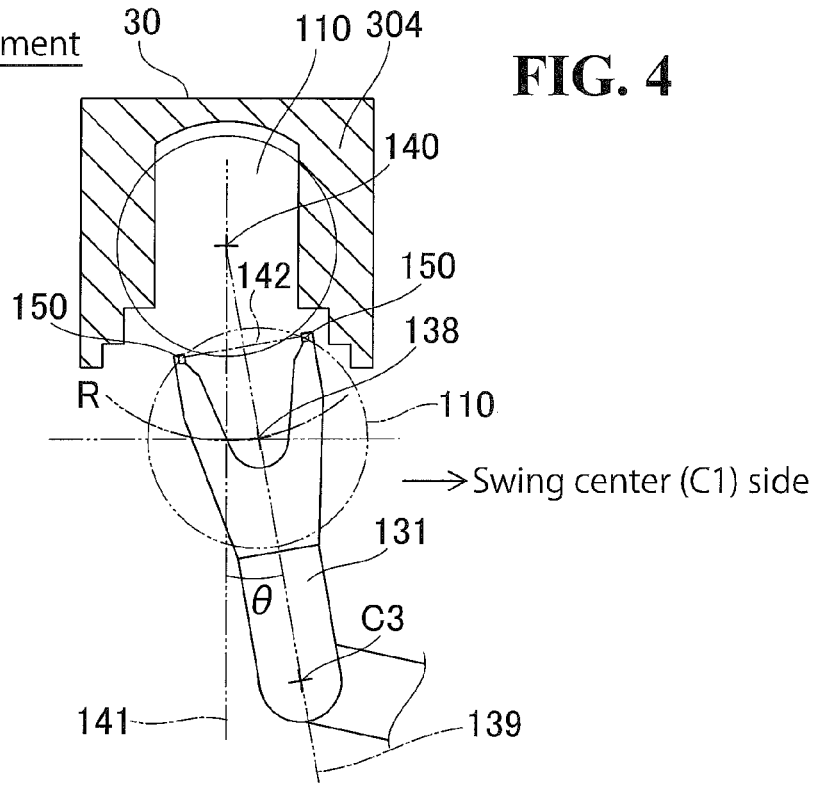
FIG. 4 illustrates a position of a hand at the time of a mapping operation in a substrate transfer system according to the first embodiment.

In the first embodiment, as shown in FIG. 4, the hand 131 includes detectors 150 to detect an arrangement state of the substrate 110 in the cassette 30 (arranged in the cassette 30). Specifically, the hand 131 is furcated at its distal end. One of the detectors 150 is disposed at the distal end of one of the furcated branches of the hand 131, and the other detector 150 is disposed at the distal end of the other furcated branch of the hand 131. The detectors 150 include a transmission optical sensor made up of, for example, a light emitting device disposed at one distal end, and a transmission optical sensor made up of, for example, a light receiving device disposed at the other distal end.

The controller 133, shown in FIG. 3, is taught in advance operations of the elements at the time when the hand 131 transfers the substrate 110. Specifically, for each of the four cassettes 30, the controller 133 is taught in advance operations of the elements associated with the take-in-and-out operation of the substrate 110 and the operation of detecting the arrangement state of the substrate 110 arranged in the cassette 30 (mapping operation).

Figure 5:
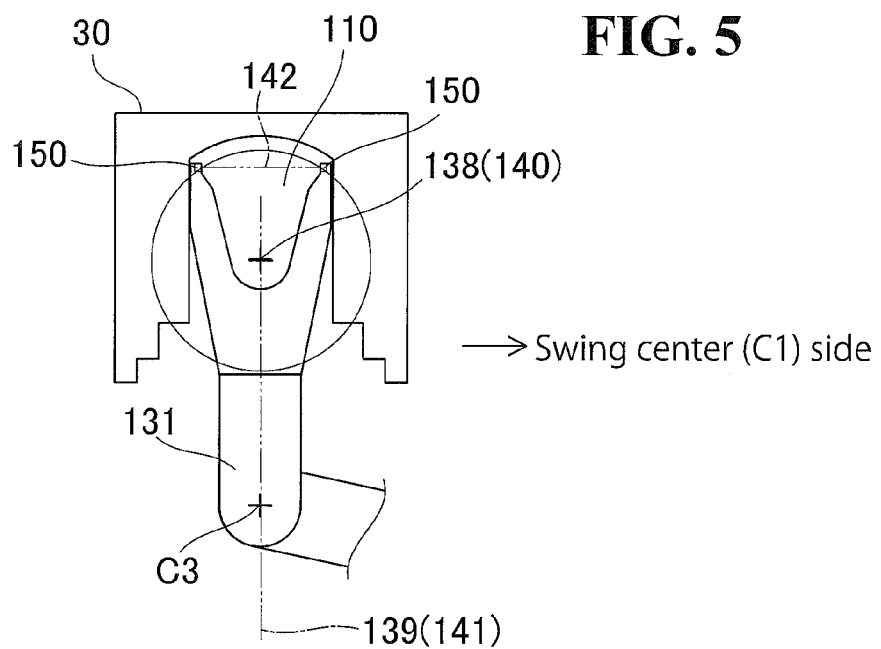
FIG. 5 illustrates a position of the hand at the time when a substrate is placed in a cassette.

In the first embodiment, as shown in FIG. 4, a hand center line 139 is a straight line connecting between the swing center C3 of the hand 131 and the substrate holding center 138 at the time when the hand 131 is holding the substrate 110. A substrate storage center line 141 is a straight line connecting between a substrate storage center 140 of the cassette 30 and the swing center C3 of the hand 131 at the time when the substrate 110 is arranged in the cassette 30 (the substrate storage center line 141 is in a direction perpendicular to the front surface of the cassette 30, that is, to the front wall 111 of the robot installment area 11). (See FIGS. 5 and 6). The controller 133 controls the detectors 150 to detect the arrangement state of the substrate 110 arranged in the cassette 30 with the hand center line 139 inclined in plan view toward the swing center of the substrate transfer robot 13 (the swing center C1 of the first arm 136) at a predetermined inclined angle θ (for example, 7.1 degrees) relative to the substrate storage center line 141. Specifically, the controller 133 controls the detectors 150 to detect the arrangement state of the substrate 110 with a straight line 142, which connects between the pair of detectors 150, overlapping the substrate 110 in plan view, with the hand 131 out of contact with the substrate 110, and with the hand center line 139 inclined toward the swing center C1 of the substrate transfer robot 13 at the predetermined inclined angle θ on a horizontal plane relative to the substrate storage center line 141. Details of the operation (mapping operation) of detecting the arrangement state of the substrate 110 will be described later.

Figure 6:
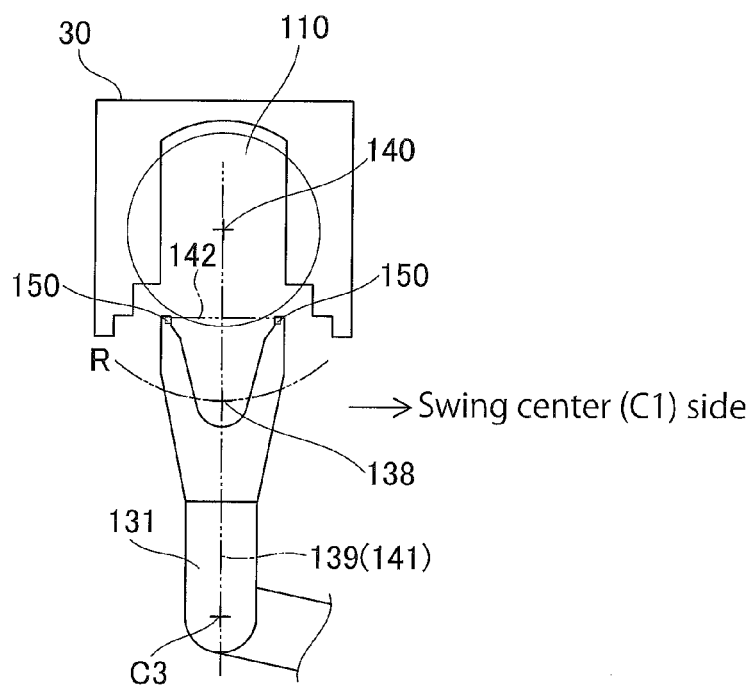
FIG. 6 illustrates a position of the hand at the time when a hand center line matches a substrate storage center line.

In the first embodiment, the controller 133 controls the detectors 150 to detect the arrangement state of the substrate 110 with the hand center line 139 inclined in plan view toward the swing center C1 of the substrate transfer robot 13 at the predetermined inclined angle θ relative to the substrate storage center line 141, and with the swing center C3 of the hand 131 positioned toward the swing center C1 of the substrate transfer robot 13. The controller 133 also controls the detectors 150 to detect the arrangement state of the substrate 110 with the hand 131 turned toward the swing center C1 of the substrate transfer robot 13 about the substrate storage center 140 of the substrate 110 arranged in the cassette 30 so that the hand center line 139 is inclined toward the swing center C1 of the substrate transfer robot 13 at the predetermined inclined angle θ relative to the substrate storage center line 141. That is, as shown in FIG. 6, the hand center line 139 matches the substrate storage center line 141. From the state shown in FIG. 6, the hand 131 moves circumferentially in the R direction around the substrate storage center 140 of the substrate 110. In this manner, the hand center line 139 is inclined toward the swing center C1 of the substrate transfer robot 13 at the predetermined inclined angle θ relative to the substrate storage center line 141.

In the first embodiment, based on the substrate storage center 140 taught in advance, the controller 133 calculates the position of the hand 131 at which the detectors 150 detect the arrangement state of the substrate 110 arranged in the cassette 30 with the hand center line 139 inclined toward the swing center C1 of the substrate transfer robot 13 at the predetermined inclined angle θ relative to the substrate storage center line 141. The controller 133 calculates the predetermined inclined angle θ, at which the hand center line 139 is inclined relative to the substrate storage center line 141, within a range that keeps the hand 131 out of contact with the cassette 30 in plan view (for example, within an entrance prohibited area 304, which is indicated by slanted lines in FIG. 4 and is set inside the cassette 30 according to the SEMI standards). Specifically, based on the substrate storage center 140 taught in advance, the controller 133 calculates the position of the hand 131 for the mapping operation while ensuring that the hand 131 (substrate holding center 138) is disposed at a predetermined distance from the cassette 30.

In the first embodiment, as shown in FIG. 1, D indicates the distance between the swing center C1 of the substrate transfer robot 13 and the swing center C3 of the hand 131 positioned at the position of the hand 131 at the time of detecting the arrangement state of the substrate 110. The distance D is equal to or less than the sum of the link length of the first arm 136 and the link length of the second arm 137 of the arm 132 (the link length L of the first arm 136+the link length L of the second arm 137=2L). Specifically, the distance D between the swing center C1 of the substrate transfer robot 13 and the swing center C3 of the hand 131 is smaller than the sum of the link length of the first arm 136 and the link length of the second arm 137 of the arm 132 (D<2L).

As shown in FIGS. 1 and 2, the processing apparatus 20 includes the rear wall 201 at the side (X1 direction side) at which the substrate transfer robot 13 and the cassettes 30 are disposed. The rear wall 201 is formed within a perpendicular plane along the Y direction. Also the rear wall 201 is approximately parallel to the front wall 111 to face the front wall 111. An approximately rectangular opening 202 is formed in the rear wall 201. As shown in FIG. 1, the opening 202 has an opening width B in the horizontal direction (Y direction) to allow the substrate 110 to be inserted through the opening 202. As shown in FIG. 2, the opening 202 has an opening length H1 in the height direction (Z direction). The opening length H1 is larger than the movable ranges of the first arm 136, the second arm 137, and the hand 131 of the substrate transfer robot 13 in the height direction.

The substrate transfer robot 13 with the above-described configuration transfers the substrate 110 in the cassette 30 through the opening 202 to a placement position in the processing apparatus 20, and transfers the substrate 110 in the processing apparatus 20 to a predetermined placement position in the cassette 30.

Each of the load ports 12 has a cassette open/close area 125 (which is an operation area provided for a door opening/closing mechanism (not shown) of the load port 12 to open and close the cassette 30, and which has a width (X direction width) W3 specified by the SEMI standards). When the substrate holding center 138 at the time when the hand 131 is holding the substrate 110 is positioned at an access start position (position at which to start approaching the cassette 30) in the vicinity of the outer circumference of the cassette open/close area 125 in plan view, then the substrate transfer robot 13 moves the hand 131 to make the hand center line 139 inclined relative to the substrate storage center line 141 (see FIG. 4 or FIG. 7). Then, the substrate transfer robot 13 moves the hand 131 to make the substrate holding center 138 reach the substrate storage center 140 in the cassette 30 with the hand center line 139 overlapping the substrate storage center line 141 (see FIG. 5). For example, when the hand 131 approaches the cassette 30b of the cassettes 30, which is farther away from the substrate transfer robot 13 than the cassette 30a is from the substrate transfer robot 13, the hand center line 139 is inclined relative to the substrate storage center line 141.

Next, description will be made with regard to the operation (mapping operation) of detecting the arrangement state of the substrate 110 arranged in the cassette 30 of the substrate transfer system 10 according to the first embodiment.

First, as shown in FIG. 4, the hand 131 is moved (positioned) with the straight line 142, which connects between the pair of detectors 150, overlapping the substrate 110 in plan view, with the hand 131 out of contact with the substrate 110, and with the hand center line 139 inclined toward the swing center C1 of the substrate transfer robot 13 at the predetermined inclined angle θ relative to the substrate storage center line 141. Here, the hand 131 is below (or above) the substrate 110.

Next, the hand 131 is moved upward (or downward) so that the detectors 150 detect the arrangement state of the substrate 110 arranged in the cassette 30. Specifically, the detectors 150 detect whether the substrate 110 is present or absent based on whether the light receiving device of the detectors 150, which are made up of transmission optical sensors, has received light emitted from the light emitting device of the detectors 150. Based on the distance over which the light emitted from the light emitting device is blocked by the substrate 110, the inclined state and other states of the substrate 110 are detected. For example, the substrate 110 is determined as inclined when the distance over which the substrate 110 blocks light is longer than the distance over which a non-inclined substrate 110 blocks light.

Thus, in the first embodiment, the controller 133 controls the detectors 150 to detect the arrangement state of the substrate 110 with the hand 131 inclined in plan view toward the swing center C1 of the substrate transfer robot 13 relative to the substrate storage center line 141, which is in a direction perpendicular to the front surface of the cassette 30 (the front wall 111 of the robot installment area 11). This ensures that the detectors 150 detect the arrangement state of the substrate 110 arranged in the cassette 30 with the hand 131 close to the swing center C1 of the substrate transfer robot 13. This, in turn, ensures detection of the arrangement state of the substrate 110 arranged in the cassette 30 even when the arm 132 (the first arm 136 and the second arm 137) of the substrate transfer robot 13 is comparatively short.

In the first embodiment, as described above, the controller 133 controls the detectors 150 to detect the arrangement state of the substrate 110 arranged in the cassette 30 with the hand center line 139 inclined in plan view toward the swing center C1 of the substrate transfer robot 13 at the predetermined inclined angle θ relative to the substrate storage center line 141. This ensures detection of the arrangement state of the substrate 110 arranged in the cassette 30 even when it is impossible to match the hand center line 139 with the substrate storage center line 141, which is in a direction perpendicular to the front surface of the cassette 30, due to the comparative shortness of the arm 132 (the first arm 136 and the second arm 137) of the substrate transfer robot 13.

In the first embodiment, as described above, the hand 131 is furcated at its distal end. One of the pair of detectors 150 is disposed at the distal end of one of the pair of furcated branches of the hand 131, and the other one of the pair of detectors 150 is disposed at the distal end of the other one of the pair of furcated branches of the hand 131. The controller 133 controls the detectors 150 to detect the arrangement state of the substrate 110 with the straight line 142, which connects between the pair of detectors 150, overlapping the substrate 110 in plan view, with the hand 131 out of contact with the substrate 110, and with the hand center line 139 inclined toward the swing center C1 of the substrate transfer robot 13 at the predetermined inclined angle θ relative to the substrate storage center line 141. This facilitates the detection of the arrangement state of the substrate 110 arranged in the cassette 30, even when the hand 131 is inclined, based on whether the straight line connecting between the pair of detectors 150 (light emitting device and light receiving device) crosses the substrate 110 (that is, whether the light receiving device has received light emitted from the light emitting device).

In the first embodiment, as described above, the controller 133 controls the detectors 150 to detect the arrangement state of the substrate 110 with the hand center line 139 inclined in plan view toward the swing center C1 of the substrate transfer robot 13 at the predetermined inclined angle θ relative to the substrate storage center line 141, and with the swing center C3 of the hand 131 positioned toward the swing center C1 of the substrate transfer robot 13. This facilitates the detection of the arrangement state of the substrate 110 arranged in the cassette 30, even when the arm 132 (the first arm 136 and the second arm 137) of the substrate transfer robot 13 is comparatively short, by positioning the swing center C3 of the hand 131 toward the swing center C1 of the substrate transfer robot 13.

In the first embodiment, as described above, the controller 133 controls the detectors 150 to detect the arrangement state of the substrate 110 with the hand 131 turned toward the swing center C1 of the substrate transfer robot 13 about the substrate storage center 140 of the substrate 110 arranged in the cassette 30 so that the hand center line 139 is inclined toward the swing center C1 of the substrate transfer robot 13 at the predetermined inclined angle θ relative to the substrate storage center line 141. This ensures that the distal end of one of the pair of furcated branches of the hand 131 moves to turn circumferentially about the substrate storage center 140 along the outer circumference of the substrate 110 arranged in the cassette 30 while keeping a constant distance from the substrate 110. In this manner, the position of the hand 131 is determined. This eliminates or minimizes contact of the distal end of the hand 131 with the substrate 110.

In the first embodiment, as described above, the distance D is the distance between the swing center C1 of the substrate transfer robot 13 and the swing center C3 of the hand 131 at the position of the hand 131 at the time of detecting the arrangement state of the substrate 110. The distance D is equal to or less than the sum, 2L, of the link length of the first arm 136 and the link length of the second arm 137 of the arm 132. This eliminates or minimizes the possibility of the hand 131 being unable to be positioned at the position of the hand 131 at the time of detecting the arrangement state of the substrate 110 due to the shortness of the length of the arm 132 (the first arm 136 and the second arm 137). This, in turn, ensures reliable detection of the arrangement state of the substrate 110 arranged in the cassette 30

In the first embodiment, as described above, the controller 133 controls the detectors 150 to detect the arrangement state of the substrate 110 with the hand center line 139 inclined toward the swing center C1 of the substrate transfer robot 13 at the predetermined inclined angle θ relative to the substrate storage center line 141 within a range that keeps the hand 131 out of contact with the cassette 30 in plan view. This ensures the detection of the arrangement state of the substrate 110 arranged in the cassette 30 while reliably eliminating the contact of the hand 131 with the cassette 30.

In the first embodiment, as described above, the substrate storage center 140 of the cassette 30 is taught in advance, and based on the substrate storage center 140 taught in advance, the controller 133 calculates the position of the hand 131 at which the detectors 150 detect the arrangement state of the substrate 110 arranged in the cassette 30 with the hand center line 139 inclined toward the swing center C1 of the substrate transfer robot 13 at the predetermined inclined angle θ relative to the substrate storage center line 141. This saves the user the labor associated with teaching the mapping operation to the substrate transfer robot 13, as opposed to the case of the user having to teach the position of the hand 131 at the time of detecting the arrangement state of the substrate 110 arranged in the cassette 30.

Second Embodiment

Next, by referring to FIG. 7, description will be made with regard to the position of the hand 131 at which to detect the arrangement state of the substrate 110 according to the second embodiment. The second embodiment is different from the first embodiment, in which the hand 131 turns about the substrate storage center 140 of the substrate 110 arranged in the cassette 30 toward the swing center C1 of the substrate transfer robot 13 (see FIG. 4). In the second embodiment, the hand 131 turns about the substrate holding center 138 at the time when the hand 131 is holding the substrate 110 toward the rotation center of the substrate transfer robot 13. The configuration of the substrate transfer system 10 according to the second embodiment is similar to the configuration of the substrate transfer system 10 according to the first embodiment (see FIGS. 1 to 3).

Figure 7:
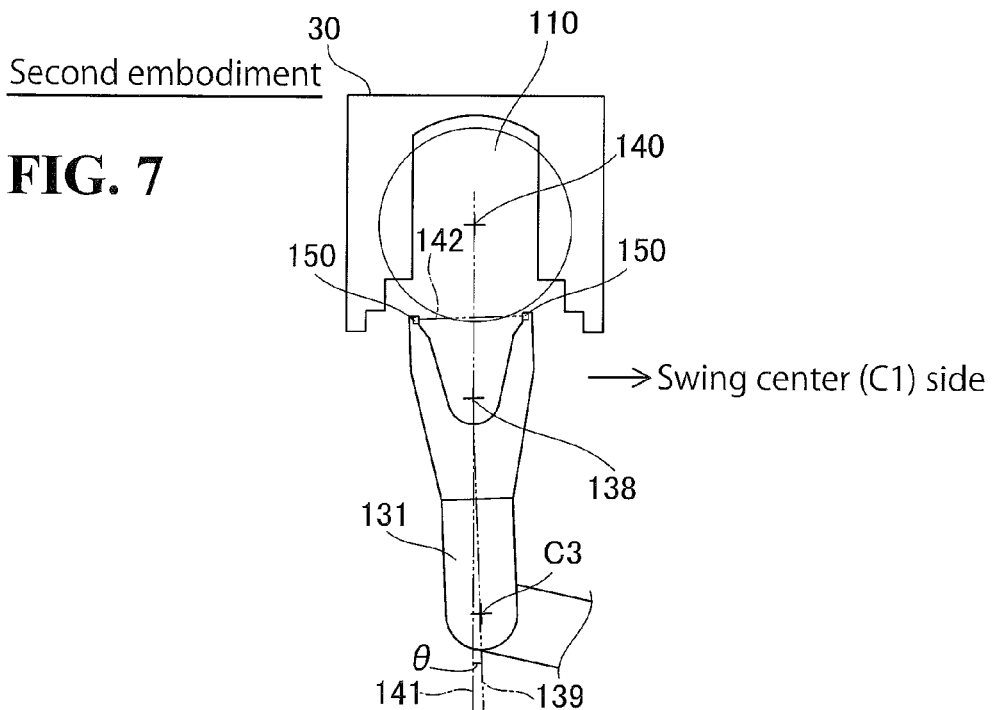
FIG. 7 illustrates a position of a hand at the time of a mapping operation in a substrate transfer system according to a second embodiment.

As shown in FIG. 7, in the substrate transfer system 10 according to the second embodiment, the controller 133 controls the detectors 150 to detect the arrangement state of the substrate 110 with the hand 131 turned toward the swing center C1 of the substrate transfer robot 13 about the substrate holding center 138 at the time when the hand 131 is holding the substrate 110 so that the hand center line 139 is inclined toward the swing center C1 of the substrate transfer robot 13 at the predetermined inclined angle θ relative to the substrate storage center line 141. Specifically, in the state shown in FIG. 6, the hand center line 139 matches the substrate storage center line 141. From the state shown in FIG. 6, the hand 131 turns about the substrate holding center 138 at the time when the hand 131 is holding the substrate 110 toward the swing center C1 of the substrate transfer robot 13 as shown in FIG. 7. Thus, the position of the hand 131 is determined. In the second embodiment, a mapping operation similar to the mapping operation in the first embodiment is performed with the hand 131 moved into the state shown in FIG. 7.

Thus, in the second embodiment, the controller 133 controls the detectors 150 to detect the arrangement state of the substrate 110 with the hand 131 turned toward the swing center C1 of the substrate transfer robot 13 about the substrate holding center 138 at the time when the hand 131 is holding the substrate 110 so that the hand center line 139 is inclined toward the swing center C1 of the substrate transfer robot 13 at the predetermined inclined angle θ relative to the substrate storage center line 141. Thus, the hand 131 turns about the substrate holding center 138, which is positioned adjacent the substrate transfer robot 13. This ensures that the hand 131 moves to (is positioned at) a desired position with a comparatively small amount of movement of the hand 131, as opposed to the case of the hand 131 turning about a reference point positioned farther away from the substrate transfer robot 13. The second embodiment is otherwise similar in advantageous effects to the first embodiment.

In the first (second) embodiment, the hand has been described as turning about the substrate storage center of the substrate arranged in the cassette (about the substrate holding center at the time when the hand is holding the substrate) toward the rotation center of the substrate transfer robot. It is also possible to turn the hand about the substrate storage center and a reference point other than the substrate holding center, and to make the hand center line inclined toward the rotation center of the substrate transfer robot at a predetermined inclined angle relative to the substrate storage center line.

In the first and second embodiments, the pair of detectors made up of transmission optical sensors (light emitting device and light receiving device) have been described as being disposed at the distal ends of the furcated branches of the hand. The hand may be provided with a detector other than a transmission optical sensor.

In the first and second embodiments, the distance D (which is the distance between the swing center of the substrate transfer robot and the swing center of the hand positioned at the position of the hand at the time of detecting the arrangement state of the substrate; see FIG. 1) has been described as being smaller than the sum, 2L, of the link length of the first arm and the link length of the second arm of the arm. The distance D between the swing center of the substrate transfer robot and the swing center of the hand may be equal to the sum of the link length of the first arm and the link length of the second arm of the arm (D=2L). When the substrate transfer robot is designed to approach the cassette 30b, which is farthest away from the swing center of the substrate transfer robot (see FIG. 1), the link length of the arm including the first arm and the second arm is minimal at D=2L.

In the first and second embodiments, the substrate transfer robot has been exemplified as a substrate transfer robot with two arms (first arm and second arm). The substrate transfer robot may be provided with a single arm or equal to or more than three arms.

In the first and second embodiments, the hand has been described as being furcated into two distal ends. The hand may have a shape other than the furcated shape with distal ends.

In the first and second embodiments, the substrate transfer robot has been exemplified as a substrate transfer robot with a single hand. The substrate transfer robot may have equal to or more than two hands.

In the first and second embodiments, the substrate transfer system has been described as having four load ports to accommodate four cassettes. The number of the cassettes (the number of the load ports) may be three or less, or five or more.

In the first and second embodiments, the substrate transfer system has been described as transferring a substrate between the cassettes and the processing apparatus using the substrate transfer robot. Other possible examples of the substrate transfer system include, but are not limited to, a substrate transfer system that transfers a substrate to and from an apparatus or a device other than the processing apparatus in the production process of semiconductor devices. Examples of such an apparatus or a device include, but are not limited to, a temporary substrate stand that forwards the substrate to the next step.

In the first and second embodiments, the robot installment area has been described as being disposed between the front wall and the rear wall approximately parallel to each other. The robot installment area may be surrounded by a first wall and a second wall orthogonal to each other.

In the first and second embodiments, the detection of the arrangement state of the substrate has been described as being performed when the substrate is arranged in the cassette of semiconductor wafer container that is open on the front and conforms with the SEMI standards. It is also possible to detect arrangement states of a plurality of wafers arranged in multiple levels of buffers. It is also possible to detect an arrangement state or another state of a single wafer arranged in the processing apparatus.

In the first and second embodiments, the substrate transfer robot has been described as having an edge-grip hand. The substrate transfer robot may be provided with a negative-pressure (vacuum) hand or an electrostatic chuck hand. The substrate transfer robot also may be provided with a hand other than an edge-grip hand, a negative-pressure hand, and an electrostatic chuck hand.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by letters patent of the United States is:

1. A substrate transfer robot comprising:
   a hand comprising at least one detector configured to detect an arrangement state of a substrate in a substrate storage; and
   a controller configured to control the at least one detector to detect the arrangement state of the substrate in the substrate storage with the hand inclined in plan view toward a rotation center of the substrate transfer robot relative to a substrate storage center line, the substrate storage center line being in a direction perpendicular to a front surface of the substrate storage,
   wherein the controller is configured to control the at least one detector to detect the arrangement state of the substrate in the substrate storage when the hand is moved beyond the front surface of the substrate storage and when the hand is inclined in plan view toward the rotation center of the substrate transfer robot relative to the substrate storage center line.

2. The substrate transfer robot according to claim 1, wherein the controller is configured to control the at least one detector to detect the arrangement state of the substrate in the substrate storage with a hand center line inclined toward the rotation center of the substrate transfer robot at a predetermined inclined angle relative to the substrate storage center line, the hand center line being a straight line connecting between a turning center of the hand and a substrate holding center, the substrate holding center being a center of holding of the substrate by the hand, the substrate storage center line being a straight line connecting between a substrate storage center of the substrate storage and the turning center of the hand at a time when the substrate is arranged in the substrate storage.

3. The substrate transfer robot according to claim 2, wherein the controller is configured to control the at least one detector to detect the arrangement state of the substrate with the hand turned toward the rotation center of the substrate transfer robot about a substrate storage center of the substrate in the substrate storage so that the hand center line is inclined toward the rotation center of the substrate transfer robot at the predetermined inclined angle relative to the substrate storage center line.

4. The substrate transfer robot according to claim 2, wherein the controller is configured to control the at least one detector to detect the arrangement state of the substrate with the hand turned toward the rotation center of the substrate transfer robot about the substrate holding center so that the hand center line is inclined toward the rotation center of the substrate transfer robot at the predetermined inclined angle relative to the substrate storage center line.

5. The substrate transfer robot according to claim 2, further comprising an arm coupled to the hand, the arm comprising:
   a first arm turnable on a horizontal plane about one end of the substrate transfer robot at a side of the rotation center of the substrate transfer robot; and
   a second arm comprising one end coupled to a distal end of the first arm, the second arm being turnable on a horizontal plane relative to the first arm,
   wherein a distance between a swing center of the substrate transfer robot and the turning center of the hand when the hand is at a position to detect the arrangement state of the substrate is equal to a sum of a link length of the first arm and a link length of the second arm of the arm.

6. The substrate transfer robot according to claim 2, wherein the controller is configured to control the at least one detector to detect the arrangement state of the substrate with the hand center line inclined in plan view toward the rotation center of the substrate transfer robot at the predetermined inclined angle relative to the substrate storage center line while ensuring that the hand is out of contact with the substrate storage.

7. The substrate transfer robot according to claim 2,
   wherein the substrate storage center of the substrate storage taught in advance, and
   wherein based on the substrate storage center taught in advance, the controller is configured to calculate a position of the hand at which the at least one detector detects the arrangement state of the substrate in the substrate storage with the hand center line inclined toward the rotation center of the substrate transfer robot at the predetermined inclined angle relative to the substrate storage center line.

8. The substrate transfer robot according to claim 2, wherein the controller is configured to control the at least one detector to detect the arrangement state of the substrate with the hand center line inclined in plan view toward the rotation center of the substrate transfer robot at the predetermined inclined angle relative to the substrate storage center line, and with the turning center of the hand positioned toward the rotation center of the substrate transfer robot.

9. The substrate transfer robot according to claim 8, wherein the controller is configured to control the at least one detector to detect the arrangement state of the substrate with the hand turned toward the rotation center of the substrate transfer robot about a substrate storage center of the substrate in the substrate storage so that the hand center line is inclined toward the rotation center of the substrate transfer robot at the predetermined inclined angle relative to the substrate storage center line.

10. The substrate transfer robot according to claim 8, wherein the controller is configured to control the at least one detector to detect the arrangement state of the substrate with the hand turned toward the rotation center of the substrate transfer robot about the substrate holding center so that the hand center line is inclined toward the rotation center of the substrate transfer robot at the predetermined inclined angle relative to the substrate storage center line.

11. The substrate transfer robot according to claim 2,
wherein the hand comprises a pair of furcated branches at a distal end of the hand,
wherein the at least one detector comprises a pair of detectors at distal ends of the pair of furcated branches of the hand, and
wherein the controller is configured to control the pair of detectors to detect the arrangement state of the substrate with a straight line connecting between the pair of detectors overlapping the substrate in plan view, with the hand out of contact with the substrate, and with the hand center line inclined toward the rotation center of the substrate transfer robot at the predetermined inclined angle relative to the substrate storage center line.

12. The substrate transfer robot according to claim 11, wherein the controller is configured to control the pair of detectors to detect the arrangement state of the substrate with the hand turned toward the rotation center of the substrate transfer robot about a substrate storage center of the substrate in the substrate storage so that the hand center line is inclined toward the rotation center of the substrate transfer robot at the predetermined inclined angle relative to the substrate storage center line.

13. The substrate transfer robot according to claim 11, wherein the controller is configured to control the pair of detectors to detect the arrangement state of the substrate with the hand turned toward the rotation center of the substrate transfer robot about the substrate holding center so that the hand center line is inclined toward the rotation center of the substrate transfer robot at the predetermined inclined angle relative to the substrate storage center line.

14. The substrate transfer robot according to claim 11, wherein the controller is configured to control the pair of detectors to detect the arrangement state of the substrate with the hand center line inclined in plan view toward the rotation center of the substrate transfer robot at the predetermined inclined angle relative to the substrate storage center line, and with the turning center of the hand positioned toward the rotation center of the substrate transfer robot.

15. The substrate transfer robot according to claim 11, further comprising an arm coupled to the hand, the arm comprising:
a first arm turnable on a horizontal plane about one end of the substrate transfer robot at a side of the rotation center of the substrate transfer robot; and
a second arm comprising one end coupled to a distal end of the first arm, the second arm being turnable on a horizontal plane relative to the first arm,
wherein a distance between a swing center of the substrate transfer robot and the turning center of the hand when the hand is at a position to detect the arrangement state of the substrate is equal to or less than a sum of a link length of the first arm and a link length of the second arm of the arm.

16. The substrate transfer robot according to claim 14, wherein the controller is configured to control the pair of detectors to detect the arrangement state of the substrate with the hand turned toward the rotation center of the substrate transfer robot about a substrate storage center of the substrate in the substrate storage so that the hand center line is inclined toward the rotation center of the substrate transfer robot at the predetermined inclined angle relative to the substrate storage center line.

17. The substrate transfer robot according to claim 14, wherein the controller is configured to control the pair of detectors to detect the arrangement state of the substrate with the hand turned toward the rotation center of the substrate transfer robot about the substrate holding center so that the hand center line is inclined toward the rotation center of the substrate transfer robot at the predetermined inclined angle relative to the substrate storage center line.

18. A substrate transfer system comprising a substrate transfer robot disposed in a substrate transfer robot installment area surrounded by a substrate storage and a processing apparatus, the substrate transfer robot comprising:
a hand comprising a detector configured to detect an arrangement state of a substrate in the substrate storage; and
a controller configured to control the detector to detect the arrangement state of the substrate in the substrate storage with the hand inclined in plan view toward a rotation center of the substrate transfer robot relative to a substrate storage center line, the substrate storage center line being in a direction perpendicular to a front surface of the substrate storage,
wherein the controller is configured to control the detector to detect the arrangement state of the substrate in the substrate storage when the hand is moved beyond the front surface of the substrate storage and when the hand is inclined in plan view toward the rotation center of the substrate transfer robot relative to the substrate storage center line.

19. A method for detecting an arrangement state of a substrate, the method comprising:
moving a hand so as to make the hand inclined in plan view toward a rotation center of a substrate transfer robot relative to a substrate storage center line, the substrate storage center line being in a direction perpendicular to a front surface of a substrate storage; and
controlling a detector disposed in the hand to detect the arrangement state of the substrate in the substrate storage with the hand inclined toward the rotation center of the substrate transfer robot relative to the substrate storage center line, wherein the controlling of the detector includes controlling the detector to detect the arrangement state of the substrate in the substrate storage when the hand is moved beyond the front surface of the substrate storage and when the hand is inclined in plan view toward the rotation center of the substrate transfer robot relative to the substrate storage center line.

20. A substrate transfer robot comprising a hand comprising a detector configured to detect an arrangement state of a substrate in a substrate storage, wherein when the detector detects the arrangement state of the substrate in the substrate storage, the hand is at a position where the hand is inclined in plan view toward a rotation center of the substrate transfer robot relative to a substrate storage center line, the substrate storage center line being in a direction perpendicular to a front surface of the substrate storage, wherein the detector detects the arrangement state of the substrate in the substrate storage when the hand is moved beyond the front surface of the substrate storage and when the hand is inclined in plan view toward the rotation center of the substrate transfer robot relative to the substrate storage center line.

* * * * *